(12) United States Patent
Wu et al.

(10) Patent No.: US 12,543,293 B2
(45) Date of Patent: Feb. 3, 2026

(54) IMMERSION COOLING FIN ASSEMBLY AND IMMERSION COOLING SYSTEM FOR TWO-PHASE IMMERSION COOLING

(71) Applicant: Taiwan Semiconductor Manufacturing Co., Ltd., Hsinchu (TW)

(72) Inventors: Tse-Hsien Wu, Hsinchu (TW); Chyi-Tsong Ni, Hsinchu (TW); Che-Yu Chiang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 115 days.

(21) Appl. No.: 18/405,906

(22) Filed: Jan. 5, 2024

(65) Prior Publication Data
US 2025/0194048 A1    Jun. 12, 2025

Related U.S. Application Data

(60) Provisional application No. 63/608,774, filed on Dec. 11, 2023.

(51) Int. Cl.
*H05K 7/20* (2006.01)
(52) U.S. Cl.
CPC ......... *H05K 7/203* (2013.01); *H05K 7/20318* (2013.01); *H05K 7/20327* (2013.01); *H05K 7/20436* (2013.01)

(58) Field of Classification Search
CPC .............. H05K 7/203; H05K 7/20318; H05K 7/20327; H05K 7/20436; H05K 7/20818
See application file for complete search history.

(56) References Cited

U.S. PATENT DOCUMENTS

| | | | |
|---|---|---|---|
| 9,433,132 B2 * | 8/2016 | Krishnan | H05K 7/20818 |
| 9,696,235 B2 * | 7/2017 | Alshinnawi | F24F 11/0001 |
| 2010/0328891 A1 * | 12/2010 | Campbell | H05K 7/20318 |
| | | | 165/104.33 |
| 2023/0080447 A1 * | 3/2023 | Shah | H05K 7/20836 |
| | | | 361/679.53 |

* cited by examiner

*Primary Examiner* — Jacob R Crum
(74) *Attorney, Agent, or Firm* — Seed IP Law Group

(57) ABSTRACT

A coolant system including one or more cooling fin assemblies that are movably coupled to a coolant tank. Each one of the one or more cooling fin assemblies has a first position (i.e., closed position) in which the one or more cooling fin assemblies are slightly tilted with respect to inner sides of the coolant tank. Each one of the one or more cooling fin assemblies has a second position (i.e., opened position) in which the one or more cooling fin assemblies are tiled by a greater amount than the first position exposing an access opening of the coolant tank such that a transfer device may access a coolant cavity within the coolant tank. Each one of the one or more cooling fin assemblies includes a cooling fin structure and a porous drip tray coupled to the cooling fin structure.

20 Claims, 15 Drawing Sheets

IMMERSION COOLING FIN ASSEMBLY AND IMMERSION COOLING SYSTEM FOR TWO-PHASE IMMERSION COOLING

PRIORITY CLAIM AND CROSS-REFERENCE

This application claims benefit of U.S. Provisional Patent Application No. 63/608,774, filed Dec. 11, 2023, which is incorporated by reference herein in its entirety.

BACKGROUND

Generally, in the manufacture of semiconductor devices or packages, simulations are performed utilizing various components such as, for example, servers, GPUs (Graphics Processing Unit), CPUs (Central Processing Unit), or other similar or like type of components configured to, in operation, be utilized to perform simulations. These simulations may include failure simulations, stress-strain simulations, or some other similar or like type of simulation that requires a high amount of processing power. When running these simulations, the servers, GPUs, CPUs, or other similar or like components heat up when in use due to the amount of processing power being utilized to perform these simulations. To avoid damaging the servers, GPUs, CPUs, or some other similar or like type of components due to their increasing temperatures when in use to perform these simulations, these servers, GPUs, CPUs, or some other similar or like type of components are placed within a coolant. For example, the servers, CPUs, CPUs, or some other similar or like type of components are positioned within a coolant stored within a coolant tank.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
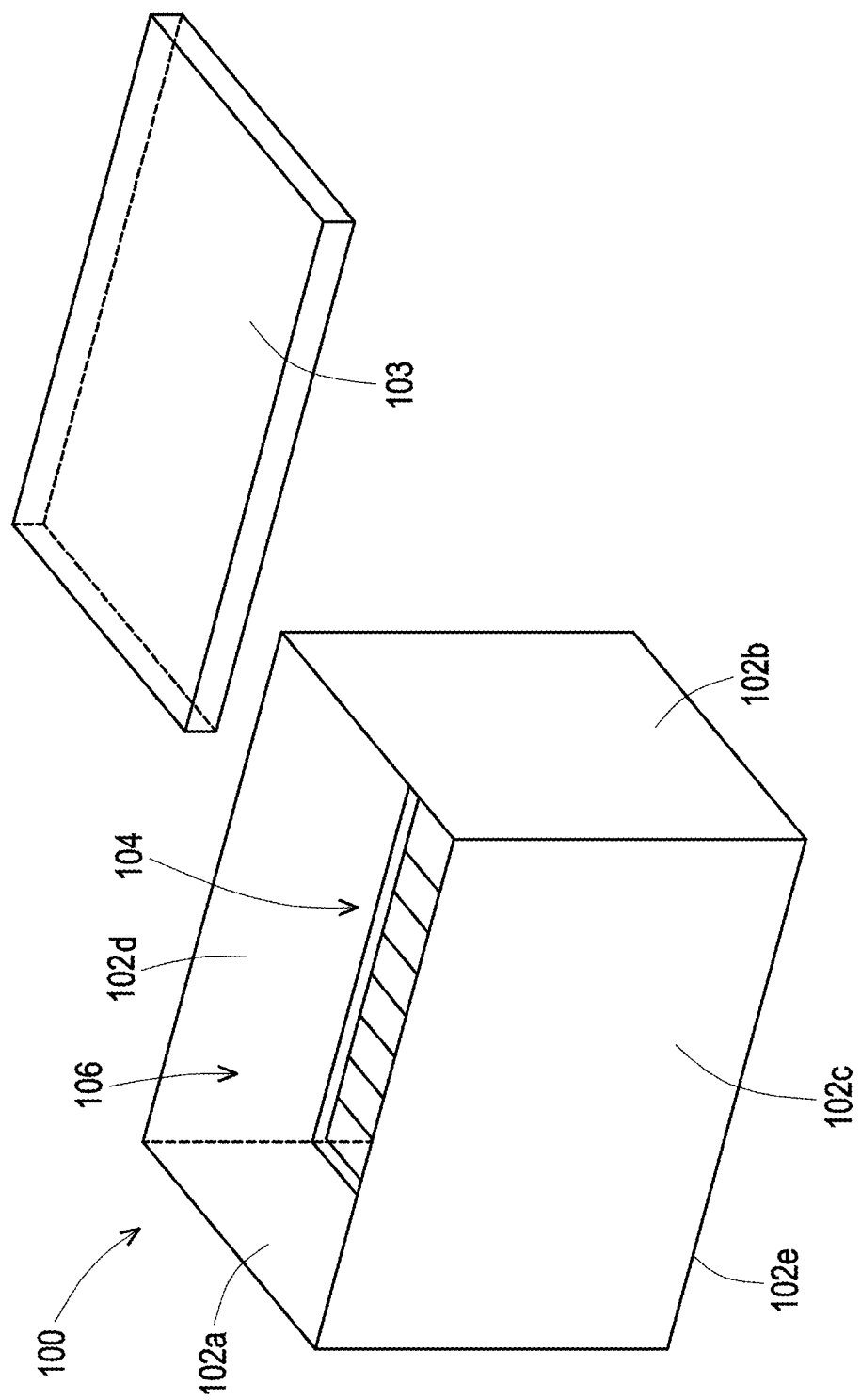
FIG. 1 is a perspective view of a coolant tank.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is directed to a coolant tank 100. The coolant tank 100 includes one or more sidewalls 102a, 102b, 102c, 102d, 102e that delimit a coolant cavity 104 within the coolant tank 100. An access opening 106 is at an upper end of the coolant tank 100 based on the orientation of the coolant tank 100 as shown in FIG. 1. While not shown in FIG. 1, a coolant in a liquid state is stored within the coolant cavity 104 of the coolant tank 100. One or more electronic components (e.g., servers, GPUs, CPUs, or some other type of electronic component or combination of electronic components) are placed within the coolant stored within the coolant tank 100. A lid or a sealing cap 103 is placed on the coolant tank 100 closing the access opening 106 and sealing the coolant cavity 104 such that the coolant remains present within the coolant cavity 104 when the electronic components within the coolant are in use.

When the electronic components are in use (e.g., performing a simulation, which may be of varying complexity), a temperature of the electronic components increases. This increase in temperature in the electronic components is mitigated by the electronic components being present within the coolant. The electronic components being present within the coolant when in use maintains the temperature of the electronic components below a selected temperature. The selected temperature may be a temperature threshold at which damage begins to propagate within the electronic components. As the temperature of the electronic components is dissipated through the coolant being in contact with the electronic components and covering the electronic components, the coolant converts from a liquid state to a vapor or gaseous state (i.e., the coolant in the liquid state evaporates into a vapor state when exposed to the increase in temperature of the electronic components when in use). The coolant in the vapor state rises up to an inner surface of the lid 103 that delimits the coolant cavity 104 and condenses on the inner surface of the lid 103. As the coolant in the vapor state condenses on the inner surface of the lid 103, the coolant converts from the vapor state back to the liquid state (i.e., the coolant in the vapor state condenses into the liquid state). This condensing of the coolant from the vapor state to the liquid state along the inner surface of the lid 103 results in coolant droplets being formed along the inner surface of the lid 103. These coolant droplets eventually drip off the inner surface of the lid 103 and back into the coolant in the liquid state stored within the coolant cavity 104 of the coolant tank 100.

The droplets dripping directly into the coolant in the liquid state may disturb or disrupt a surface of the coolant in the liquid state. The coolant droplets dripping directly back into the coolant in the liquid state results in the efficiency of the coolant in the liquid state to cool down or mitigate the increase in temperature of the electronic components when in use to be lowered. For example, the coolant droplets may be warmer or hotter than an average temperature of the coolant in the liquid state in which the electronic components are present when in use. These warmer or hotter coolant droplets increases the average temperature of the coolant in the liquid state in which the electronic components are present when in use decreasing an overall efficiency of the coolant to mitigate the increasing temperature of the electronic components when in use. The present disclosure is directed to providing embodiments of coolant systems that provide greater efficiency in mitigating an increase in temperature of electronic components when in use relative to the coolant tank 100.

Figure 2A:
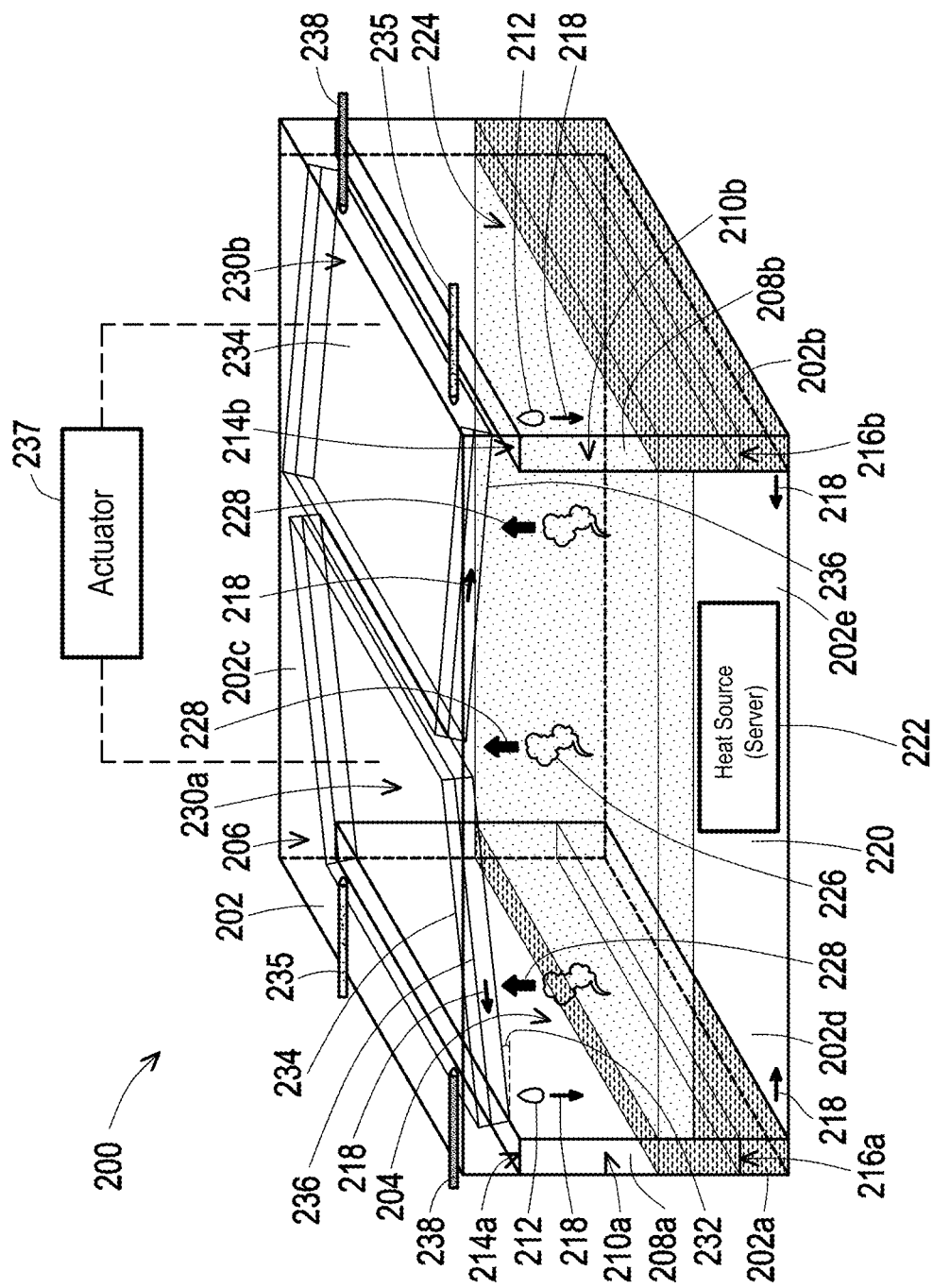
FIG. 2A is a perspective view of a coolant system with one or more cooling fin assemblies in a first position, in accordance with some embodiments.

FIG. 2A is directed to a perspective view of a coolant system 200, in accordance with some embodiments. The coolant system 200 includes a coolant tank 202 including a coolant cavity or space 204, an access opening 206 that provides access to the coolant cavity 204, and one or more coolant flow structures 208a, 208b.

The coolant tank 202 includes one or more sidewalls 202a, 202b, 202c, 202d, 202e. In the embodiment of the coolant tank 202 as shown in FIG. 2A, the one or more sidewalls includes a first sidewall 202a, a second sidewall 202b, a third sidewall 202c, a fourth sidewall 202d, and a fifth sidewall 202e. The first sidewall 202a is opposite to the second sidewall 202b, the third sidewall 202c is opposite to the fourth sidewall 202d, and the fifth sidewall 202e is transverse to the first, second, third, and fourth sidewalls 202a, 202b, 202c, 202d and extends between the first, second, third, and fourth sidewalls 202a, 202b, 202c, 202d. Based on the orientation as shown in FIG. 2A, the fifth sidewall 202e is a bottom sidewall of the coolant tank 202.

In the embodiment of the coolant system 200 as shown in FIG. 2A, the one or more coolant flow structures 208a, 208b includes a first coolant flow structure 208a that extends along an inner side of the first sidewall 202a and a second coolant flow structure 208b is along an inner side of the second sidewall 202b. The first and second coolant flow structures 208a, 208b are hollow defining respective fluid channels 210a, 210b to direct a flow of condensed coolant or coolant droplets 212. Respective inlets 214a, 214b are at respective upper ends of the first and second coolant flow structures 208a, 208b and respective outlets 216a, 216b are at lower ends of the first and second coolant flow structures 208a, 208b. A condensation flow direction of the flow of the condensed coolant or coolant droplets 212 is represented by arrows 218. The flow of the condensed coolant 212 will be discussed in further detail later herein.

A coolant 220 is stored within the coolant cavity 204 of the coolant tank 202. The coolant 220 at least partially fills the coolant cavity 204 of the coolant tank 202. A heat source 222 is within the coolant 220. The heat source 222 is at least partially submerged within the coolant 220. The heat source 222 is an electronic component that generates heat when in operation. For example, the heat source 222 may be one or more servers, one or more GPUs, one or more CPUs, or one or more other suitable type of electronic components or combination of electronic components that generate heat when in operation. In at least one embodiment, the heat source 222 is one or more servers, which may more readily be seen in FIG. 2B of the present disclosure. The coolant 220 includes a coolant surface 224 that is below the respective inlets 214a, 214b of the first and second coolant flow structures 208a, 208b.

A vapor coolant 226 in a vapor state evaporates from the coolant 220 due to the heat source 222 heating up the coolant 220 when the heat source 222 is in operation. The vapor coolant 226 flows in a vapor flow direction as represented by arrows 228. The flow of the vapor coolant 226 will be discussed in further detail later herein.

Figure 2B:
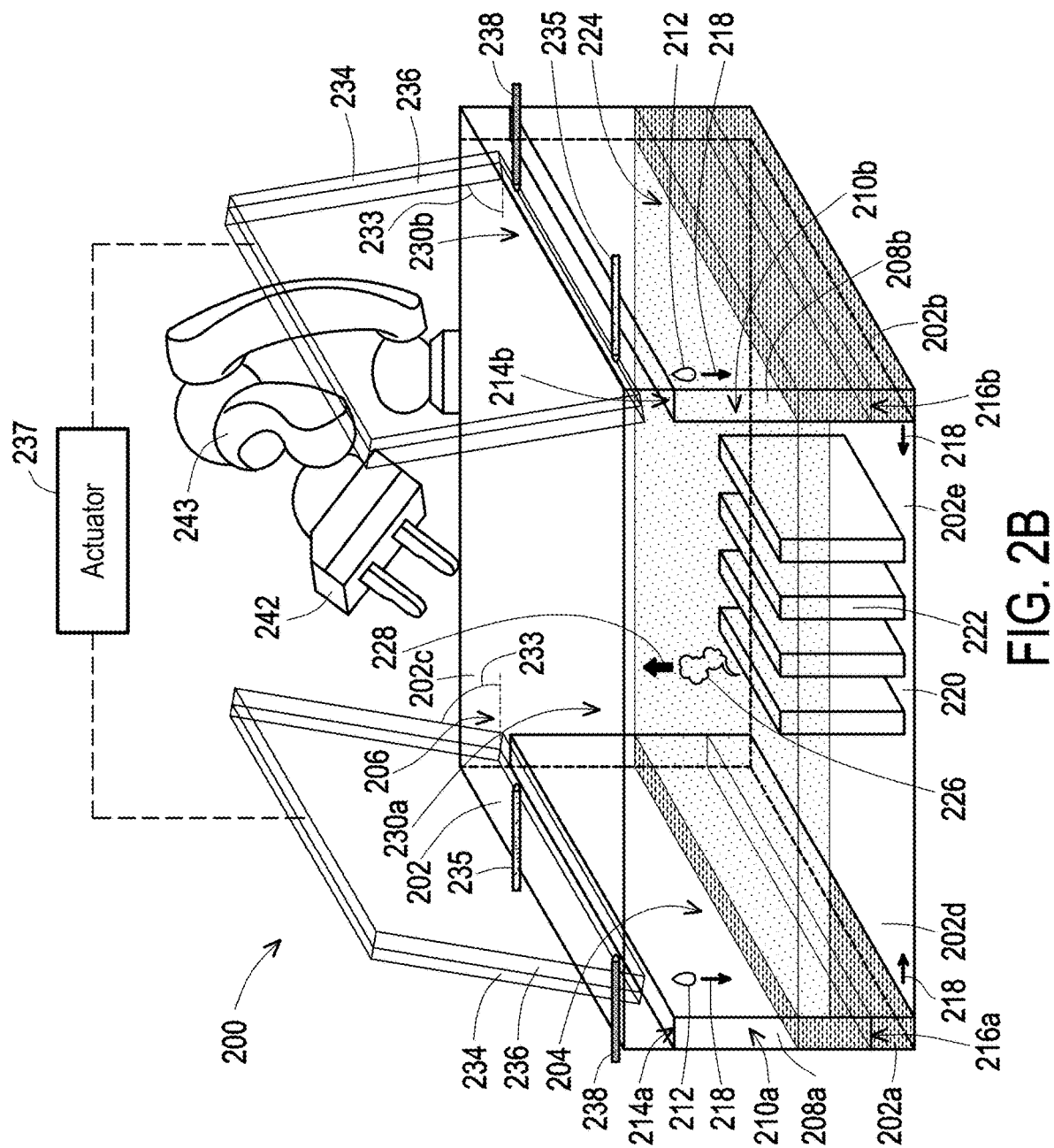
FIG. 2B is a perspective view of a coolant system with one or more cooling fin assemblies in a second position, in accordance with some embodiments.

One or more coolant cooling fin assemblies 230a, 230b are rotatably coupled to the coolant tank 202. In this embodiment of the coolant system 200 as shown in FIG. 2A, the one or more cooling fin assemblies 230a, 230b include a first cooling fin assembly 230a and a second cooling fin assembly 230b. The first and second cooling fin assemblies 230a, 230b are in closer proximity to the access opening 206 than the fifth sidewall 202e of the coolant tank 202. The first and second cooling fin assemblies 230a, 230b are in a first position (i.e., a closed position) in which the first cooling fin assembly 230a is at a first angle 232 relative to an inner side of the first sidewall 202a, and the second cooling fin assembly 230b is at the first angle 232 relative to an inner side of the second sidewall 202b. In some embodiments, when the first and second cooling fin assemblies 230a, 230b are in the first position (i.e., the closed position as shown in FIG. 2A), the first and second cooling fin assemblies 230a, 230b overlap at least 50% of the area of the coolant surface 224. In some embodiments, when the first and second cooling fin assemblies 230a, 230b are in the first position (i.e., the closed position as shown in FIG. 2A), the first and second cooling fin assemblies 230a, 230b overlap at least 75% of the area of the coolant surface 224. In some embodiments, when the first and second cooling fin assemblies 230a, 230b are in the second position (i.e., the opened position as shown in FIG. 2B), the first and second cooling fin assemblies 230a, 230b overlap no more than 25% of the area of the coolant surface 224.

Each one of the first and second cooling fin assemblies 230a, 230b includes a fin structure 234 and a porous drip tray 236 coupled to the fin structure 234. The porous drip trays 236 are at respective lower sides of the fin structures 234 based on the orientation as shown in FIG. 2A such that the porous drip trays 236 are overlapped by respective lower sides of the fin structures 234.

At least one actuator 237 is in mechanical cooperation with the first and second cooling fin assemblies 230a, 230b. The at least one actuator 237 is configured to, in operation, rotate the first and second cooling fin assemblies from the first position (i.e., the closed position) to a second position (i.e., an opened position as shown in FIG. 2B) in which the first angle 232 is rotated to a second angle 233 (see FIG. 2B of the present disclosure). In the embodiment of the coolant system 200 as shown in FIGS. 2A and 2B, the first and second cooling fin assemblies 230a, 230b are coupled to the coolant tank 202 by respective hinges such that the first and second cooling fin assemblies 230a, 230b are rotatable between the first position (i.e., the closed position as shown in FIG. 2A) and the second position (i.e., the opened position as shown in FIG. 2B).

In some embodiments, first angle 232 is greater than or equal to 0 degrees. For example, the first angle 232 may range from 1 degree to 20 degrees, or be equal to the upper and lower ends of this range. In other words, the first angle 232 may be some other angle greater than 0 degrees.

In some embodiments, the second angle 233 is greater than or equal to 45 degrees, may range from 45 degrees to 89 degrees or be equal to the upper and lower ends of this range. In other words, the second angle For example, in at least one embodiment, the first angle 232 may be equal to 1 degree and the second angle may be equal to 89 degrees. In this at least one embodiment, the first and second cooling fin assemblies 230a, 230b are movable to any angle between the first angle 232 (e.g., a closed position) and the second angle 233 (e.g., an opened position).

Fluid inlets 235 are in fluid communication with fluidic passageways 239 (see FIG. 3A of the present disclosure) that pass and extend through the fin structures 234 of the first and second cooling fin assemblies 230a, 230b. Fluid outlets 238 are in fluid communication with the fluidic passageways 239 and are at opposite ends of the fluidic passageways 239 relative to the fluid inlets 235. The fluid inlets 235 and the fluid outlets 238 are in fluid communication with one or more fluid sources 240 (see FIG. 2B of the present disclosure). For example, in some embodiments, the fluid inlet 235 and the fluid outlet 238 at the left-hand side of FIG. 2A may be in fluid communication with a first fluid source and the first inlet 235 and the first outlet 238 at the right-hand side of FIG. 2A may be in fluid communication with a second fluid source separate and distinct from the first fluid source. In an alternative embodiment, all of the first inlets 236 and the fluid outlets 238 as shown in FIG. 2A may be in fluid communication with a single fluid source.

FIG. 2B is directed to a perspective view of the coolant system 200, in accordance with some embodiments, with the first and second cooling fin assemblies 230a, 230b. The first and second cooling fin assemblies 230a, 230b are moved from the first position (i.e., the closed position) at the first angle 232 to the second position (i.e., the opened position) at the second angle 233 by operating the at least one actuator 237. However, unlike FIG. 2A in which the first and second cooling fin assemblies 230a, 230b are at the first angle 232 in the closed position, the first and second cooling fin assemblies 230a, 230b are at the second angle 233 in the opened position. When the first and second cooling fin assemblies 230a, 230b are in the opened position at the second angle 233, the access opening 206 of the coolant tank 202 is accessible such that an end effector 242 of a transfer device 243, which is a transfer arm robot (TRA) in the embodiment as shown in FIG. 2B, may be inserted through the access opening 206 into the coolant cavity 204. Once inserted into the coolant cavity 204, the end effector 242 is at least partially inserted into the coolant 220 and is then actuated to grip or contact at least one of the heat sources 222 (e.g., servers as shown in FIG. 2B). The at least one heat source 222 that the end effector 242 grips onto is then removed from the coolant tank 202 by removing the end effector 242 and the at least one heat source 222 from the coolant tank 202.

While in FIG. 2B the first and second cooling fin assemblies 230a, 230b are shown fully in the second position (i.e., the opened position as shown in FIG. 2B), the first and second cooling fin assemblies 230a, 230b may be positioned or adjusted to be at any intermediate position between the first position (i.e., the closed position as shown in FIG. 2A) and the second position as shown in FIGS. 2A and 2B. In some embodiments or situations, the first and second cooling fin assemblies 230a, 230b may not need to be fully moved to the second position from the first position such that the end effector 242 of the transfer device 243 may be inserted between the first and second cooling fin assemblies 230a, 230b and into the coolant cavity 204 to insert or remove the one or more heat sources 222. In some embodiments, the first and second positions as shown in FIGS. 2A and 2B may be at different locations.

While in FIGS. 2A and 2B, the first and second cooling fin assemblies 230a, 230b are rotatable between the first position (i.e., the closed position as shown in FIG. 2A) and the second position (i.e., the opened position as shown in FIG. 2B), in some alternative embodiments, the first and second cooling fin assemblies 230a, 230b may be movable along a rail system (i.e., see FIGS. 7A and 7B of the present disclosure) to move the first and second cooling fin assemblies 230a, 230b from a closed position to an opened position.

In some embodiments, when the first and second cooling fin assemblies 230a, 230b are in their opened position (e.g., similar to the second position as shown in FIG. 2B of the present disclosure), the first and second cooling fin assemblies 230a, 230b leave no more than 25% of the coolant surface 224 of the coolant 220 exposed. In other words, at least 75% of the coolant surface 224 of the coolant 220 is covered by the first and second cooling fin assemblies 230a, 230b when the first and second cooling fin assemblies 230a, 230b are in their opened positions.

Figure 3A:
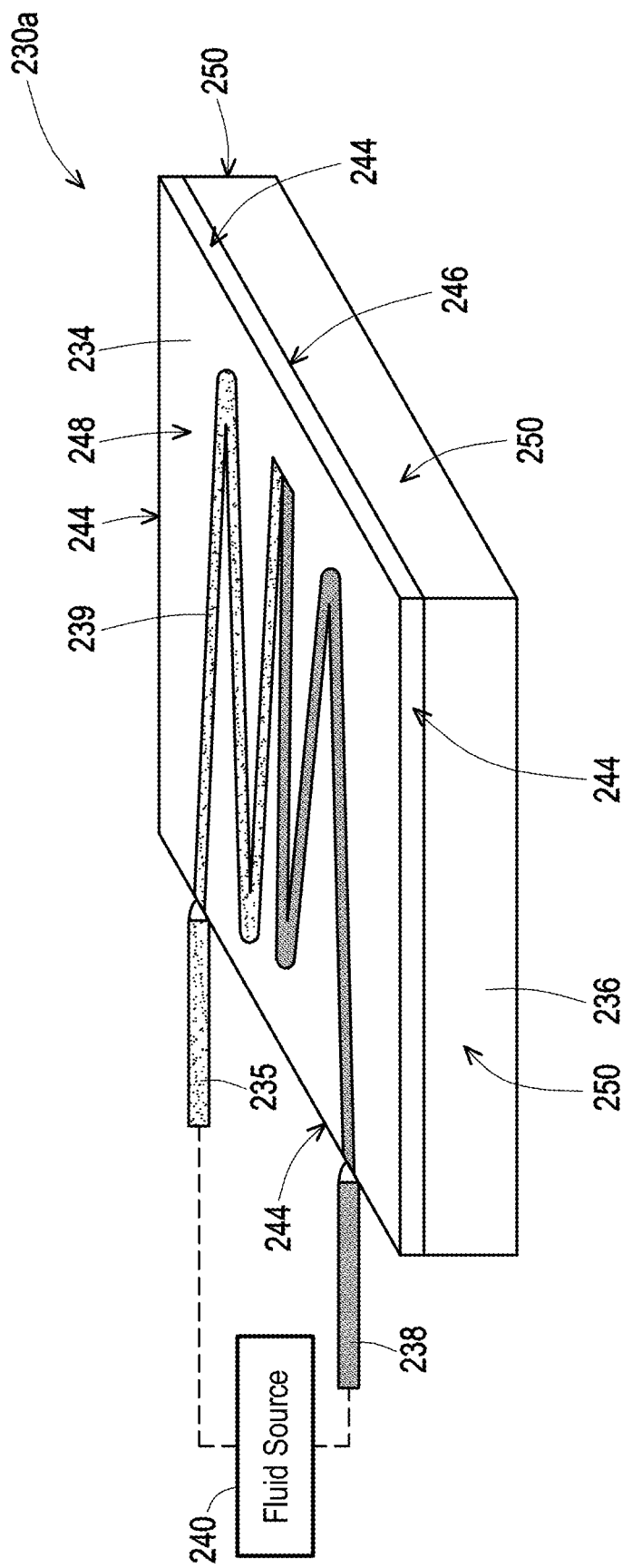
FIG. 3A is a perspective view of a cooling fin assembly, in accordance with some embodiments.
Figure 3B:
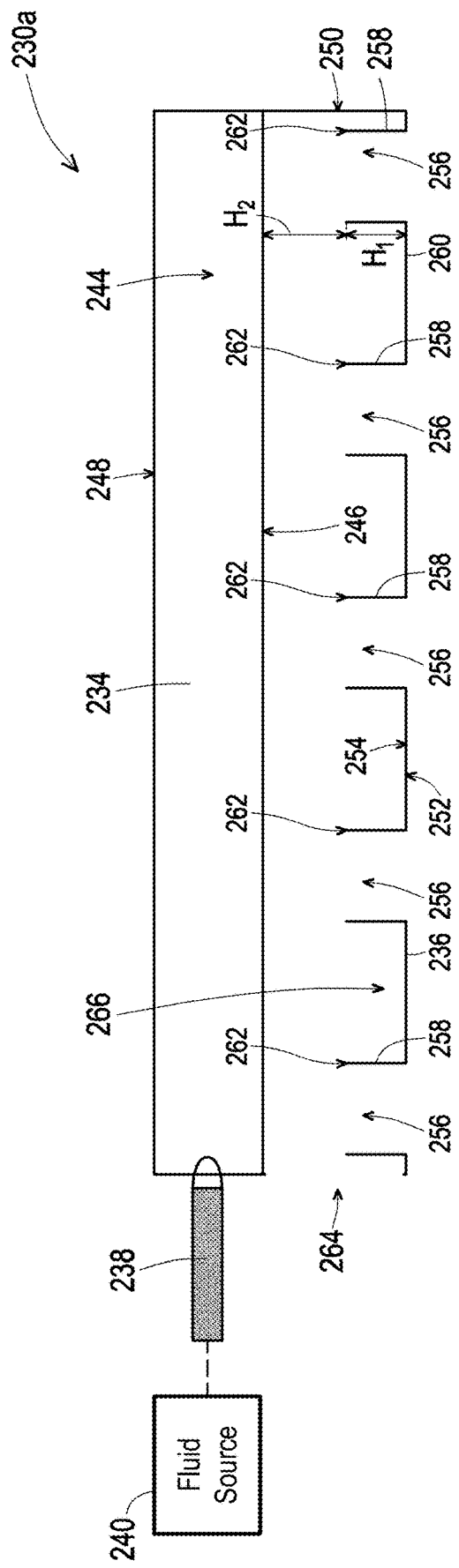
FIG. 3B is a side view of the cooling fin assembly as shown in FIG. 3A, in accordance with some embodiments.
Figure 3C:
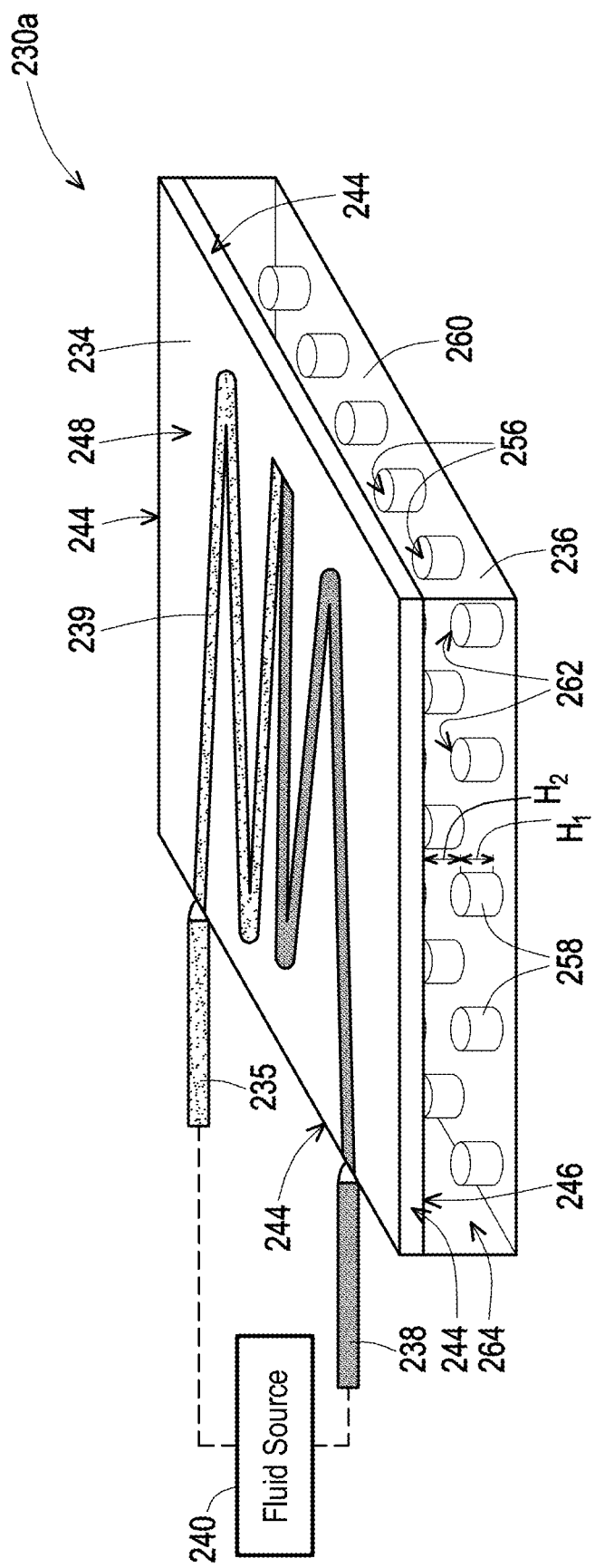
FIG. 3C is a perspective view of the cooling fin assembly with sidewalls of a porous drip tray being transparent for visibility of one or more openings of the porous drip tray as shown in FIGS. 3A and 3B, in accordance with some embodiments.
Figure 3D:
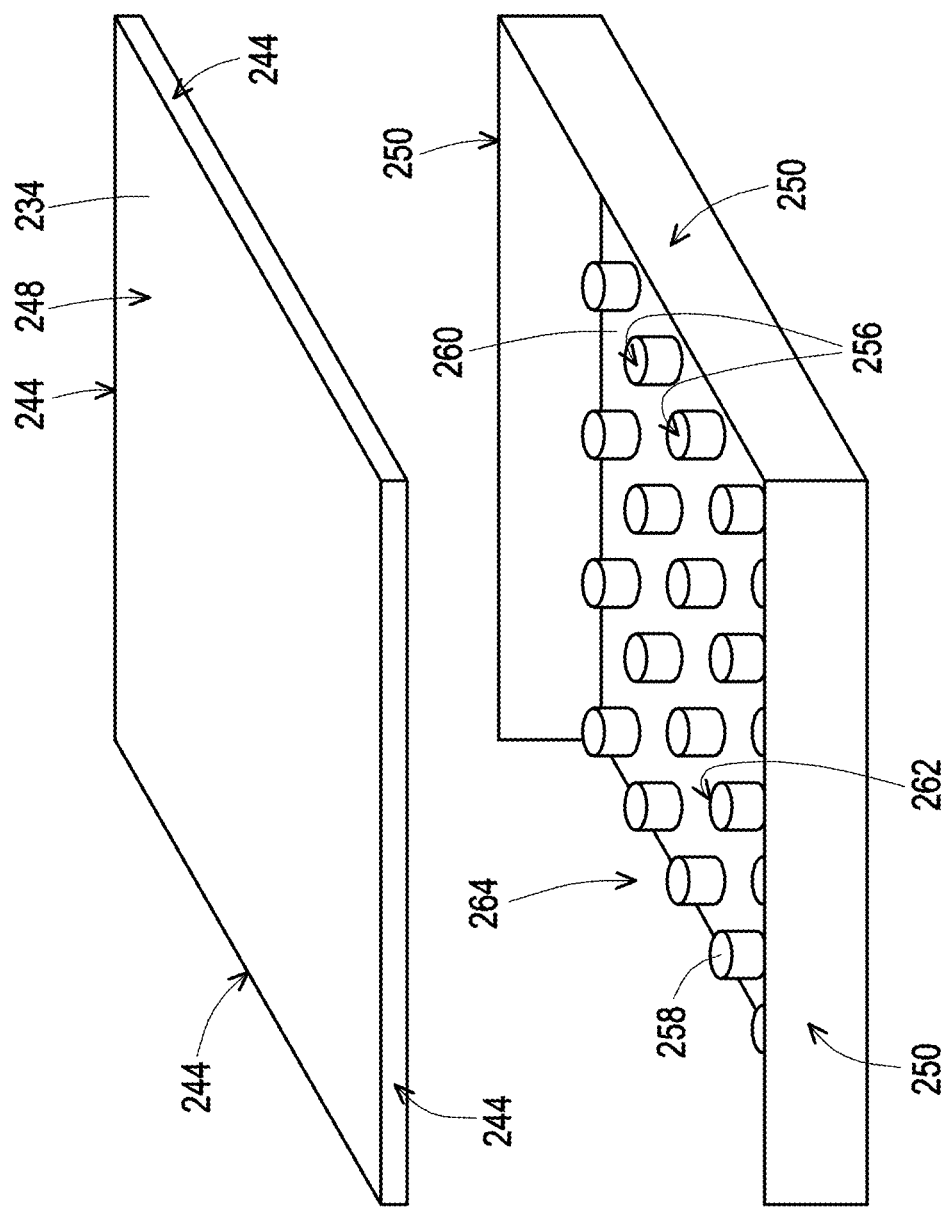
FIG. 3D is an exploded view of the cooling fin assembly as shown in FIGS. 3A-3C, in accordance with some embodiments.
Figure 3E:
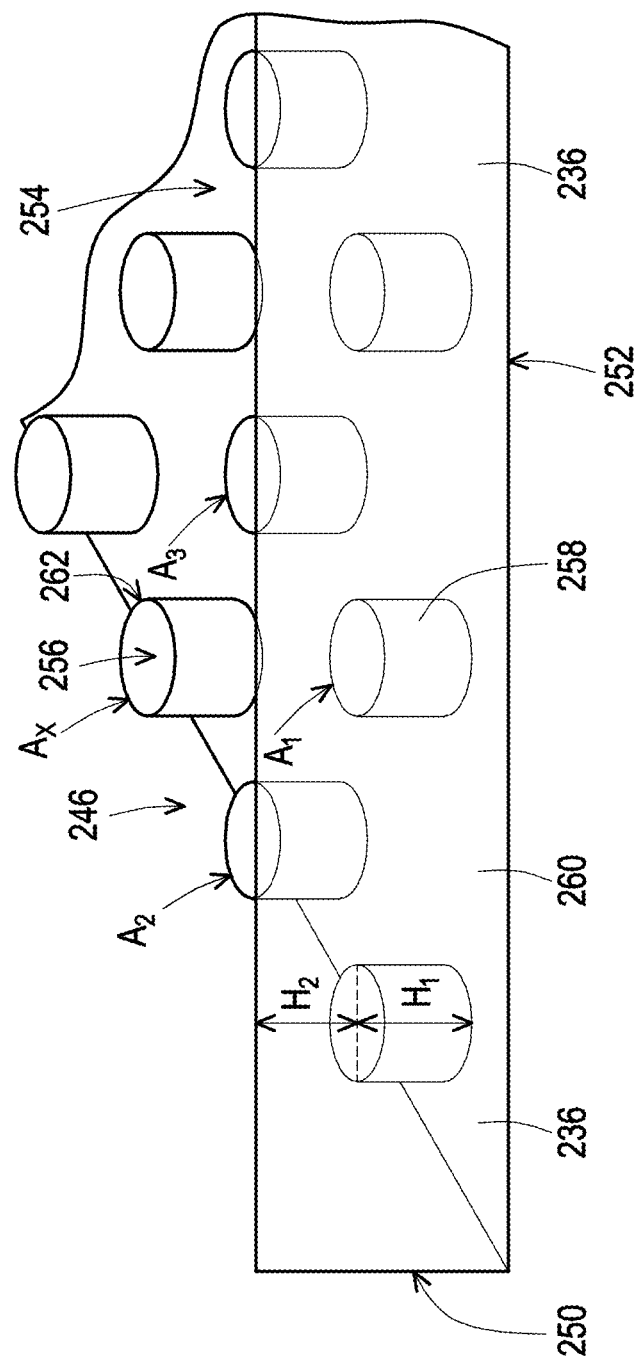
FIG. 3E is a zoomed in, enhanced view of a section of the porous drip tray as shown in FIGS. 3C and 3D, in accordance with some embodiments.

FIG. 3A is a perspective view of respective one of the cooling fin assemblies 230a, 230b as shown in FIGS. 2A and 2B, in accordance with some embodiments. FIG. 3B is a side view of the respective one of the cooling fin assemblies 230a, 230b as shown in FIGS. 2A and 2B, in accordance with some embodiments. FIG. 3C is a perspective view of the respective one of the cooling fin assemblies 230a, 230b as shown in FIGS. 2A and 2B with some structures or portions being transparent for visibility of other structures or portions, in accordance with some embodiments. FIG. 3D is an exploded view of the respective one of the cooling fin assemblies 230a, 230b as shown in FIGS. 2A and 2B, in accordance with some embodiments. FIG. 3E is a zoomed in, enhanced view of a section of the respective one of the cooling fin assemblies 230a, 230b as shown in FIGS. 3C and 3D, in accordance with some embodiments. While only the following respective one of the cooling fin assemblies 230a, 230b (e.g., the first cooling fin assembly 230a) will be discussed with respect to FIGS. 3A-3E, it will be readily appreciated that the following discussion applies to both the first cooling fin assembly 230a and the second cooling fin assembly 230b as shown in FIGS. 2A and 2B, in accordance with some embodiments.

As shown in FIG. 3A, the first cooling fin assembly 230a includes the fin structure 234 and the porous drip tray 236. The porous drip tray 236 is at a respective lower side of the fin structure 234 based on the orientation as shown in FIG.

3A such that the porous drip tray 236 is overlapped by the respective lower side of the fin structure 234.

The fin structure 234 includes one or more first sidewalls 244, a first surface 246, and a second surface 248 opposite to the first surface 246. The one or more sidewalls 244 extend from the first surface 246 to the second surface 248, and the one or more sidewalls 244 are transverse to first and second surfaces 246, 248. In the embodiment as shown in FIG. 3A, the one or more sidewalls 244 are transverse to the first and second surfaces 246, 248 by an angle of 90 degrees (i.e., perpendicular or orthogonal). In some alternative embodiments, the one or more sidewalls 244 may be transverse to the first and second surfaces at an angle different than 90 degrees.

The porous drip tray 236 includes one or more second sidewalls 250, a fourth surface 252, and a fifth surface 254 (see FIG. 3B of the present disclosure). The fifth surface 254 may be referred to as a drip tray surface. The one or more second sidewalls 250 are transverse to the fourth and fifth surfaces 252, 254. In the embodiment as shown in FIG. 3A, the one or more sidewalls 244 are transverse to the first and second surfaces 246, 248 by an angle of 90 degrees (i.e., perpendicular or orthogonal). In some alternative embodiments, the one or more sidewalls 244 may be transverse to the first and second surfaces at an angle different than 90 degrees.

In the embodiment of the first cooling fin assembly 230a, the one or more sidewalls 250 of the porous drip tray 236 are coplanar with the one or more sidewalls 244 of the fin structure 234. In some alternative embodiments, the one or more sidewalls 250 of the porous drip tray 236 may extend laterally outward from corresponding ones of the one or more sidewalls 244 of the fin structure 234.

As shown in FIG. 3B, a respective sidewall of the one or more sidewalls 250 of the porous drip tray 236 is transparent or hidden such that one or more pore openings 256 of the porous drip tray 236 are readily visible. Each respective pore opening of the one or more pore openings 256 is surrounded by a corresponding pore structure or one or more pore structures 258, which may be referred to as pore protrusions. Each one of the one or more pore structures 258 extends from a drip tray portion 260 of the porous drip tray 236 towards the first surface 246 of the fin structure 234. Each one of the one or more pore structures 258 includes an end 262 that is between the first surface 246 of the fin structure 234 and the fifth surface 254 of the porous drip tray 236.

Each one of the one or more pore structures 258 has a first dimension H1 (e.g. first height) that extends from the fourth surface 252 to the corresponding end 262 of the one or more pore structures 258. Each of the ends 262 of the one or more pore structures is spaced apart from the first surface 246 of the fin structure 234 by a second dimension H2 (e.g., second height). In some embodiments, the first dimension H1 may be greater than or equal to 1 mm (millimeter). In some embodiments, the second dimension H2 may be greater than or equal to 1 mm (millimeter). In some embodiments, the first dimension H1 may be less than the second dimension H2.

A side opening 264 of the porous drip tray 236 is at the left-hand side of FIG. 3B. The side opening 264 is in fluidic communication with a space 266 delimited between the first surface 246 of the fin structure 234, is delimited by the one or more pore structures 258, and is delimited by the fifth surface 254 of the porous drip tray 236. For example, in some embodiments, there is no sidewall present at the left-hand side of the porous drip tray 236 such that the side opening 264 is present at the left-hand side of the porous drip tray 236 as shown in FIG. 3B.

A total area (e.g., a sum of the area of the one or more pore openings 256) of the pore openings 256 is greater than or equal to 10% of an area of the first surface 246 of the fin structure 234. For example, an equation representative of determining the total area of the pore openings 256 relative to the first surface 246 of the fin structure is represented as follows (the representation for this equation may be seen in FIG. 3E of the present disclosure in which each of the one or more pore openings 256 has a corresponding area $A_1, A_2, A_3, A_x$, and so forth):

$$\sum_{k=1}^{x} A_k > A_{fin} \times 10\%$$

$A_k$ = Area of a Pore Opening 256

$A_{fin}$ = Area of First Surface 246 of Fin Structure 234

As shown in FIG. 3C, in this embodiment of the porous drip tray 236, the pore structures 258 have a cylindrical shape and profile. In some alternative embodiments of the porous drip tray 236, the pore structures 258 may have some other three-dimensional prism shape such as a cuboid, a rectangular prism, or some other similar or like type of three-dimensional prism. The pore openings 256 shape and profile is defined depending on the shape and profile of the pore structures 258.

As shown in FIG. 3D, the porous drip tray 236 is detached from the fin structure 234. While not shown, the porous drip tray 236 and the fin structure 234 may be attached or coupled to each other by one or more fasteners (e.g., screws, bolts, nuts, snap fit fasteners, pressure fit fastening structures, etc.) or in some other suitable fashion such that the porous drip tray 236 and the fin structure are removably or permanently attached or coupled to each other.

The porous drip tray 236 and the fin structure 234 have a rectangular shape or profile as readily visible in FIG. 3D. In some embodiments, the porous drip tray 236 has a shape or profile the same or similar to the fin structure 234 such that the porous drip tray 236 mimics the shape and profile of the fin structure 234 and vice versa. In some alternative embodiments, the porous drip tray 236 and the fin structure 234 may have a shape or profile that is different from each other.

The one or more sidewalls 250 of the porous drip tray 236 are present along three edges or sides of the dip tray portion 260 and are transverse to the drip tray portion 260 as readily visible in FIG. 3D. The one or more sidewalls 250 are not present along one edge or side of the drip tray portion 260, and, instead, the opening 264 is present at that one edge or side of the drip tray portion 260.

Shown in FIG. 3E are some of the one or more pore structures 258 and pore openings 256 of the porous drip tray 236. As discussed earlier herein, each of the pore structures has the first dimension H1 (e.g., the first height) and the upper ends 262 that are spaced apart from the first surface 246 of the fin structure 234 by the second dimension H2 (e.g., the second height). Each one of the one or more pore openings 256 has an area $A_x$. In the embodiment as shown in FIG. 3E, the area $A_x$ for each of the one or more pore openings 256 is the same or similar to an area of a circle (e.g., $\pi r^2 = A_x$). When the one or more pore openings 256 have a different shape than a circle, the area of each one of the one or more pore openings 256 will be calculated based on that different shape of the one or more pore openings 256. While only four areas (e.g., $A_1, A_2, A_3$, and $A_x$) are labeled in FIG. 3E, it will be readily understood that each of the one or more pore openings 256 has an area as represented by $A_x$ as shown in FIG. 3E.

Figure 4:
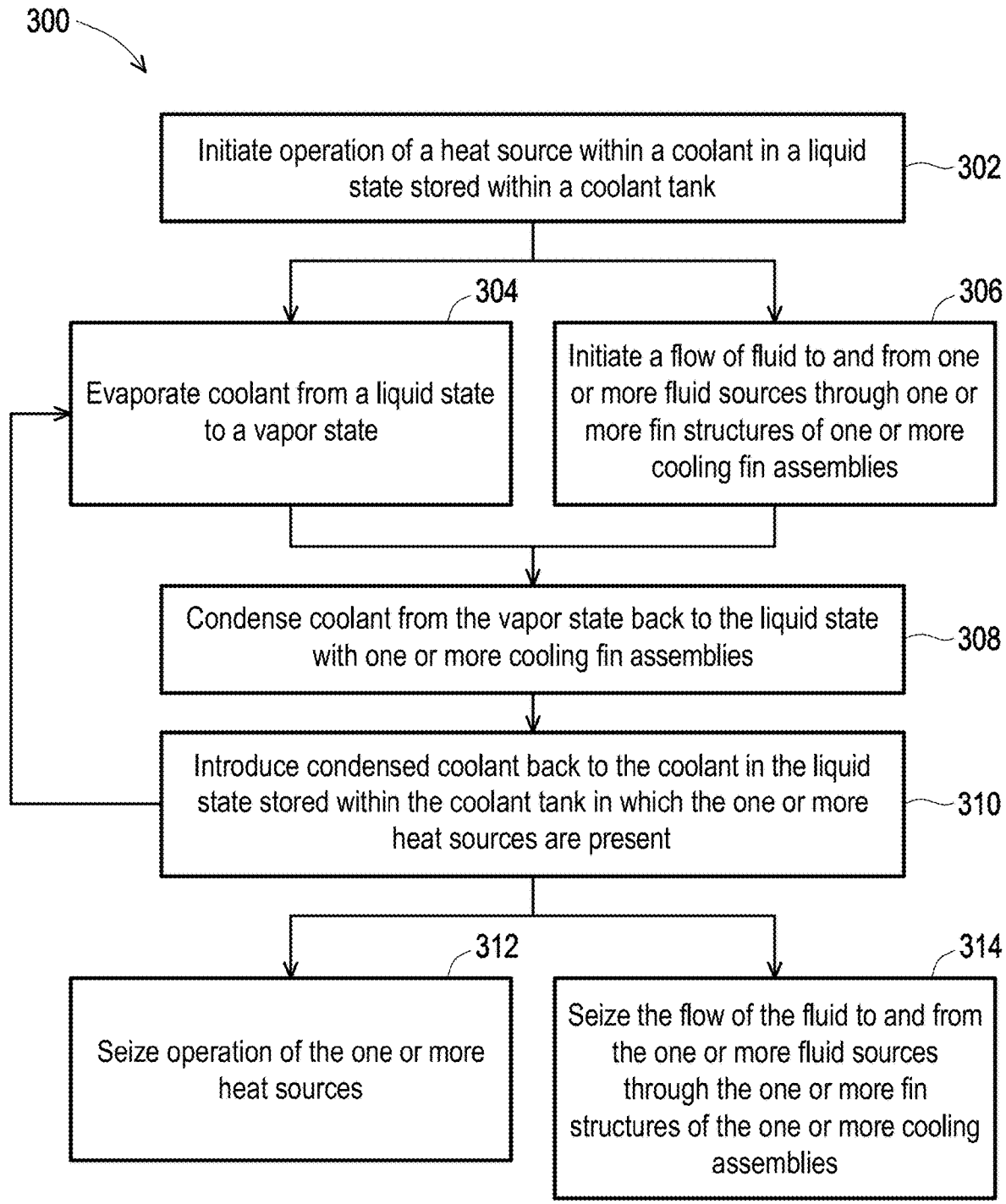
FIG. 4 is a flowchart of a method of utilizing the cooling fin assembly as shown in FIGS. 3A-3E, in accordance with some embodiments.

FIG. 4 is a flowchart 300 of a method of utilizing the coolant system 200 including the first and second cooling fin assemblies 230a, 230b as shown in FIGS. 2A and 2B, in accordance with some embodiments. The flowchart 300 includes a first step 302, a second step 304, a third step 306, a fourth step 308, a fifth step 310, a sixth step 312, and a seventh step 314. It will be readily appreciated that reference to these various numbered steps does not necessarily indicate an exact order in which these respective steps occur in various embodiments of the method of utilizing the coolant system 200 of the flowchart 300.

In the first step 302, the first and second cooling fin assemblies 230a, 230b are in the first position (i.e., the closed position) as shown in FIG. 2A. If the first and second cooling fin assemblies 230a, 230b are not yet in the first position (i.e., the closed position), the first and second cooling fin assemblies 230a, 230b are moved away from the second position (i.e., the opened position) to the first position (i.e., closed position). As discussed earlier herein, when the first and second cooling fin assemblies 230a, 230b are in the first position, the first and second cooling fin assemblies 230a, 230b are at the first angle 232 with respect to the respective inner sides of the first and second sidewalls 202a, 202b, respectively. Once the first and second cooling fin assemblies 230a, 230b are in the first position (i.e., the closed position), operation of the one or more heat sources 222 present within the coolant 220, which is stored in the coolant tank 202 in the liquid state, is initiated resulting in the one or more heat sources 222 outputting thermal energy.

After initiation of the one or more heat sources 222 in the coolant 220 in the first step, in the second step 304, the outputting of the thermal energy by the one or more heat sources 222 increases a temperature of the coolant 220 stored within the coolant tank 202 until the coolant 220 that is in the liquid state begins to evaporate into the vapor coolant 226, which is in the vapor or gaseous state. The vapor coolant 226 begins to rise towards the first and second cooling fin assemblies 230a, 230b as represented by the arrows 228 (see FIGS. 2A, 5A, 5B, and 5C of the present disclosure). As the vapor coolant 226 reaches the first and second cooling fin assemblies 230a, 230b, the vapor coolant 226 passes through the one or more pore openings 256 of the porous drip trays 236 of the first and second cooling fin assemblies 230a, 230b. The vapor coolant 226 continues to rise through the one or more pore openings 256 until the vapor coolant rises to and reaches the first surfaces 246 of the fin structures 234 of the first and second cooling fin assemblies 230a, 230b.

Figure 5A:
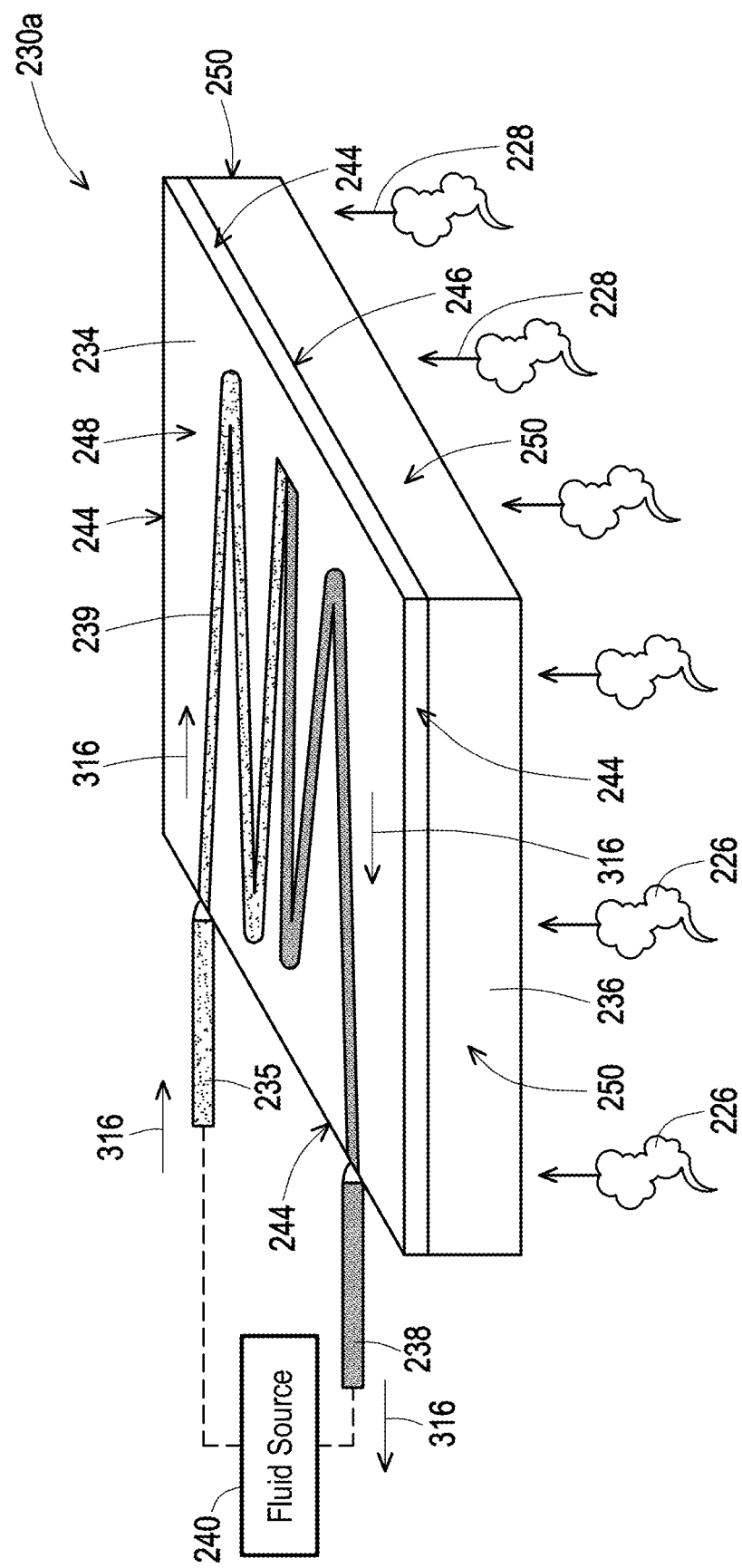
FIGS. 5A-5C illustrate steps of the flowchart as shown in FIG. 4, in accordance with some embodiments.

After the first step 302, in the third step 306, a flow of fluid is initiated to and from the one or more fluid sources 240 to allow the fluid to readily pass into the fluid inlets 235, through the fluidic passageways 239, and out of the fluid outlets 238 of the first and second cooling fin assemblies 230a, 230b. The flow of fluid from the one or more fluid sources 240 into the fluid inlets 235, through the fluidic passageways 239, and out of the fluid outlets 238 of the first and second cooling fin assemblies 230a, 230b is represented by arrows 316 as shown in FIG. 5A of the present disclosure. The initiating the flow of the fluid through the fluid inlets 235, through the fluidic passageways 239, and out of the fluid outlets 238 of the first and second cooling fin assemblies 230a, 230b decreases the temperature of the first and second cooling fin assemblies. The fluid flowing from the one or more fluid sources 240 into the fluid inlets 235, through the fluidic passageways 239, and out of the fluidic outlets 238 of the first and second cooling fin assemblies 230a, 230b may be water such as from a city source or a water source within a semiconductor manufacturing plant (FAB) or some other type of suitable coolant in a fluid state. The flow of this fluid to and from the one or more fluid sources 240 into the fluid inlets 235, through the fluidic passageways 239, and out of the fluid outlets 238 of the first and second cooling fin assemblies 230a, 230b continuously occurs during the second step 304, the fourth step 308, and the fifth step 310. The flow of the fluid to and from the one or more fluid sources 240 into the fluid inlets 235, through the fluidic passageways 239, and out of the fluid outlets 238 of the first and second cooling fin assemblies 230a, 230b stops once the seventh step 314 occurs, which will be discussed in further detail later herein.

The flow of the fluid to and from the one or more fluid sources 240 passing into the fluid inlets 235, the fluidic passageways 239, and out of the fluid outlets 238 of the fin structures 234 of the first and second cooling fin assemblies 230a, 230b absorbs thermal energy from the vapor coolant 226 present within the space 266 and transfers the absorbed thermal energy away from the cooling fin assemblies 230a, 230b back to the one or more fluid sources 240. A cooling system may be in thermal communication with the one or more fluid sources 240 such that the cooling system continuously decreases the temperature of the fluid stored within the one or more fluid sources 240. For example, as the flow of fluid passes through the fluidic passageways 239, the fluid increases in temperature as the thermal energy of the vapor coolant 226 is transferred to the fluid through the first surfaces 246 of the fin structures 234 of the first and second cooling fin assemblies 230a, 230b. In other words, the fluid enters the fluidic passageways 239 through the fluid inlets 235 being at a first temperature and exits the fluidic passageways 239 through the fluid outlets 238 at a second temperature that is greater than the first temperature. The fluid, which is at the second temperature, exiting the fluid outlets 238 is then transferred back to the one or more fluid sources 240 and the fluid is brought back down to the first temperature.

Figure 5B:
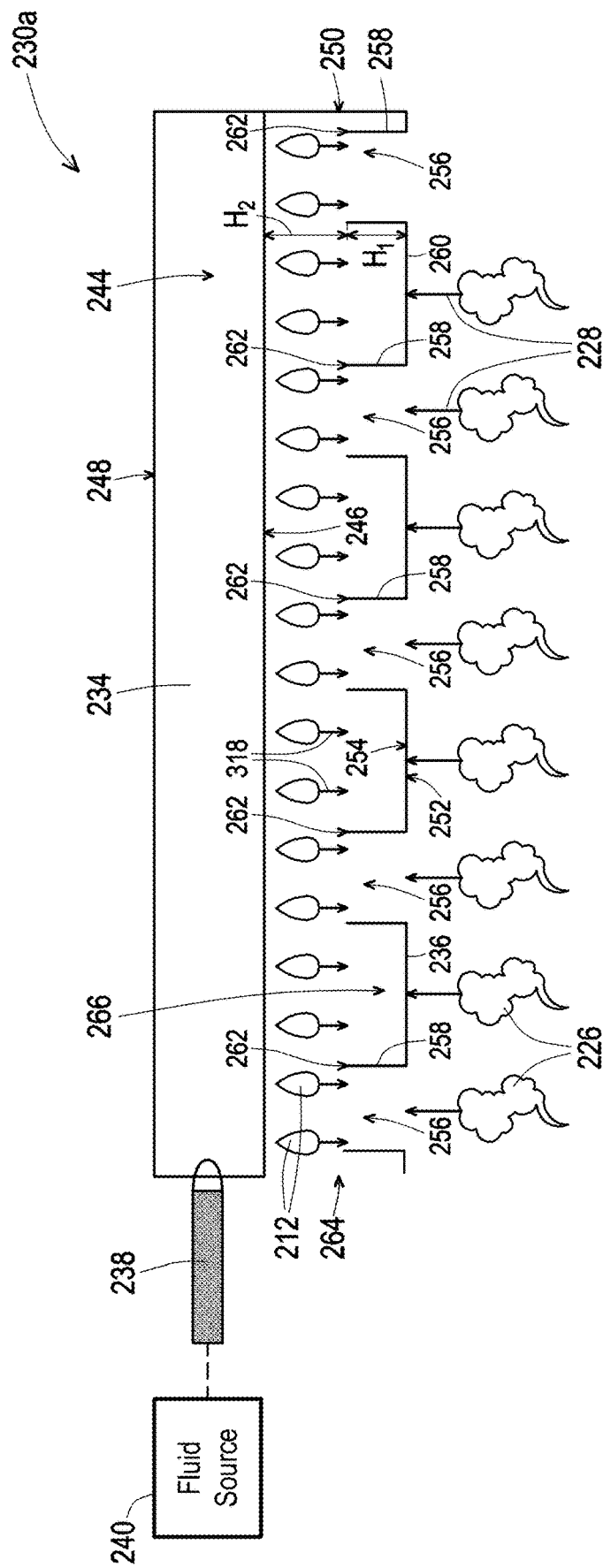
Figure 5C:
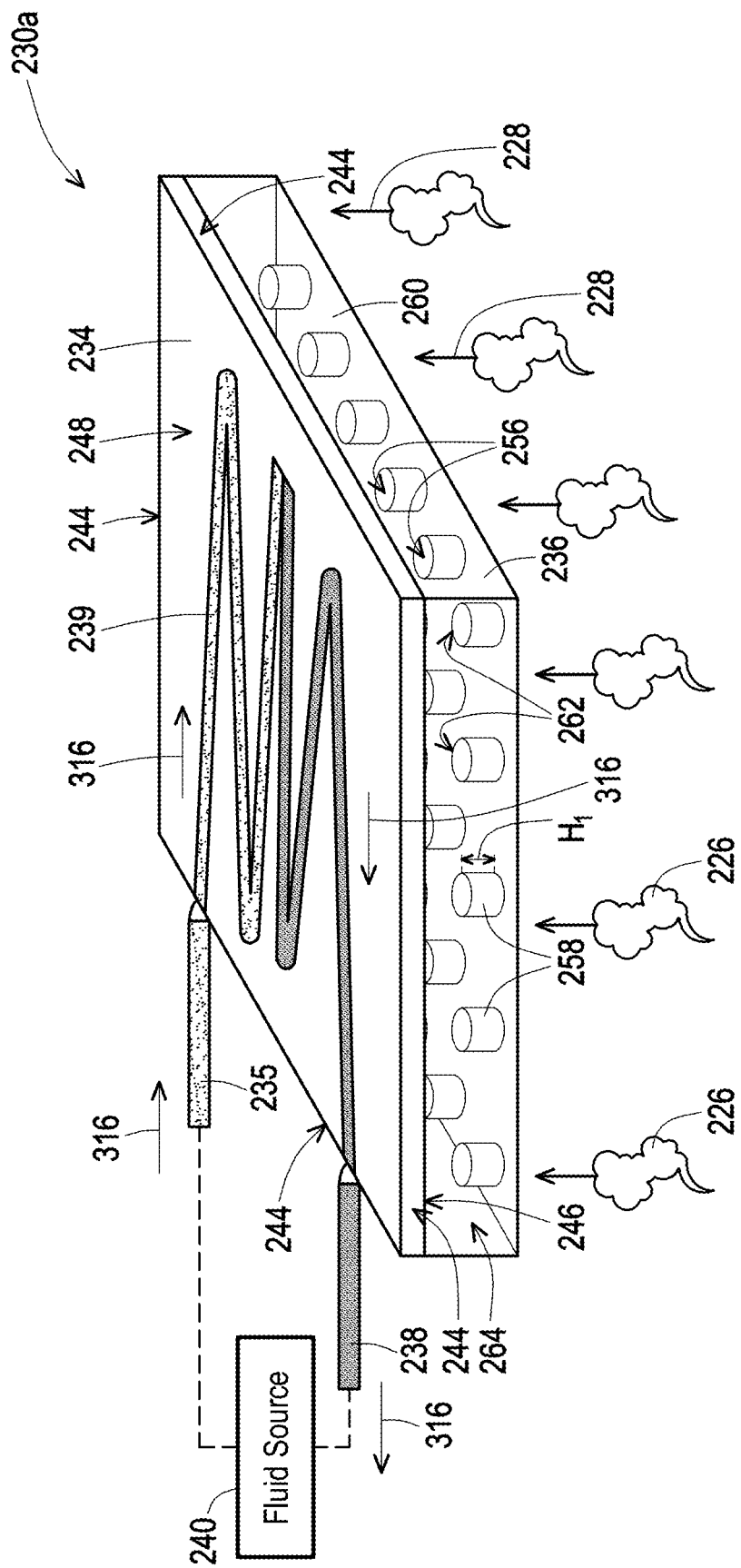

After the second step 304 in which the coolant 220 in the liquid state evaporates to the vapor coolant 226 in the vapor or gaseous state, in the fourth step 308, the vapor coolant 226 is condensed from the vapor or gaseous state back to the liquid state forming the coolant droplets 212 (see FIGS. 2A, 2B, and 5B of the present disclosure). The vapor coolant 226 condenses along the first surfaces 246 of the fin structures 234 the first and second cooling fin assemblies 230a, 230b. The vapor coolant 226 condenses along the first surfaces 246 of the fin structures 234 of the first and second cooling fin assemblies 230a, 230b due to the flow of fluid from the one or more fluid sources 240 passing into the fluid inlets 235, through the fluidic passageways 239, and out of the fluid outlets 238 of the fin structures 234 of the first and second cooling fin assemblies 230a, 230b decreasing the temperature of the fin structures 234 of the first and second cooling fin assemblies 230a, 230b. As the coolant droplets 212 form on the first surfaces 246 of the first and second cooling fin assemblies 230a, 230b, the coolant droplets 212 drop off the first surfaces 246 of the fin structures 234 of the first and second cooling fin assemblies 230a, 230b once large enough such that the weight or size of the coolant droplets (e.g., gravity) overcomes the adhesive or cohesive forces between the coolant droplets 212, which are in the liquid state, and the first surfaces 246 of the fin structures 234 of the first and second cooling fin assemblies 230a, 230b. This may be referred to as a solid-liquid interface between the first surfaces 246 (e.g., solid surface or interface) and the coolant droplets 212 (e.g., liquid surface or interface). The coolant droplets 212 dropping or falling of the first surfaces 246 of the fin structures 234 of the first and second cooling fin assemblies 230a, 230b is represented by arrows 318.

While not shown, respective coolant droplet direction structures may be present along the first surfaces 246 of the fin structures 234 of the first and second cooling fin assemblies 230a, 230b such that the coolant droplets 212 are directed towards dropping onto the fifth surface 254 of the porous drip trays 236 of the first and second cooling fin assemblies 230a, 230b instead of falling back through the one or more pore openings 256 of the porous drip trays 236 of the first and second cooling fin assemblies 230a, 230b. When these respective coolant droplet direction structures are present along the first surfaces 246 of the fin structures 234 of the first and second cooling fin assemblies 230a, 230b, the coolant droplets 212 dropping into and through the one or more pore openings 256 of the porous drip trays 236 of the first and second cooling fin assemblies 230a, 230b is further reduced or is prevented.

It will be readily appreciated that some of the coolant droplets 212 may drop into and through respective ones of the one or more pore openings 256 of the porous drip trays 236 of the first and second cooling fin assemblies 230a, 230b. However, while some of the coolant droplets 212 may drop through the one or more pore openings 256, the frequency or number of the coolant droplets 212 is relatively low and a majority of the coolant droplets 212 drop onto the fifth surfaces 254 of the drip tray portions 260 of the porous drip trays 236 of the first and second cooling fin assemblies 230a, 230b.

While the third step 306 is shown as occurring after the first step 302 in the flowchart 300 of the method of utilizing the system 200, in some alternative embodiment the method of utilizing the system 200, the third step 306 may occur before the first step 302 or may occur simultaneously along with the first step 302.

After the fourth step 308 in which the coolant droplets 212 are formed by condensing the vapor coolant 226 back to the liquid state along the first surfaces 246 of the fin structures 234 of the first and second cooling fin assemblies 230a, 230b, in the fifth step 310, the coolant droplets 212 are introduced back into the coolant 220 in the liquid state stored within the coolant tank 202. As the first and second cooling fin assemblies 230a, 230b are at the first angle 232 (e.g., slightly tilted upward as shown in FIG. 2A when in the first position (i.e., the closed position)) relative to the respective inner sides of the first and second sidewalls 202a, 202b, respectively, the coolant droplets 212 move along the fifth surfaces 254 of the drip tray portions 260 of the porous drip trays 236 of the first and second cooling fin assemblies 230a, 230b such that coolant droplets 212 flow along the fifth surfaces 254 to the side openings 264 of the porous drip trays 236 of the first and second cooling fin assemblies 230a, 230b. This flow of the coolant droplets 212 along the fifth surfaces 254 to the side openings 264 is represented by the arrows 218 as shown in FIG. 2A of the present disclosure. Once the coolant droplets 212 reach the side openings 264 of the porous drip trays 236 of the first and second cooling fin assemblies 230a, 230b, the coolant droplets 212 flow through the side openings 264 of the porous drip trays 236 of the first and second cooling fin assemblies 230a, 230b and into a corresponding one of the first and second fluid channels 210a, 210b of the first and second coolant flow structures 208a, 208b to direct the flow of the coolant droplets 212 back to the coolant 220 stored within the coolant tank 202 without disrupting the coolant surface 224 of the coolant 220. As the first and second coolant flow structures 208a, 208b have lower ends submerged within the coolant 220, the coolant droplets 212 are reintroduced into the coolant 220 stored within the coolant tank 202 without coming into contact with the coolant surface 224 extending between the first and second cooling fin assemblies 230a, 230b. The flow of the coolant droplets 212 through the first and second coolant flow structures 208a, 208b and back into the coolant 220 is represented by the arrows 218 as shown in FIGS. 2A and 2B of the present disclosure.

While the one or more heat sources 222 are operating (e.g., turned on) generating thermal energy causing the coolant 220 in the coolant tank 202 to evaporate from the liquid state to the vapor coolant 226 in the vapor or gaseous state, the second, third, fourth, and fifth steps continue to occur continuously to efficiently maintaining respective temperature of the one or more heat sources. For example, when the one or more heat sources 222 are servers, maintaining the respective temperature of the servers is critical to prevent thermal damage (e.g., heat damage) to the servers.

In the sixth step 312, the operation of the one or more heat sources is stopped or seized. After the sixth step 312, in the seventh step 314, the flow of fluid from the one or more fluid sources 240 into the fluid inlets 235, through the fluidic passageways 239, and out of the fluid outlets 238 of the fin structures 234 of the first and second cooling fin assemblies 230a, 230b is stopped or seized. In some embodiments, the seventh step 314 may occur after the sixth step 312 after a selected period of time such that any remaining of the vapor coolant 226 present is allowed to condense into the coolant droplets 212 and be introduced back to the coolant 220 within the coolant tank 202.

Figure 6:
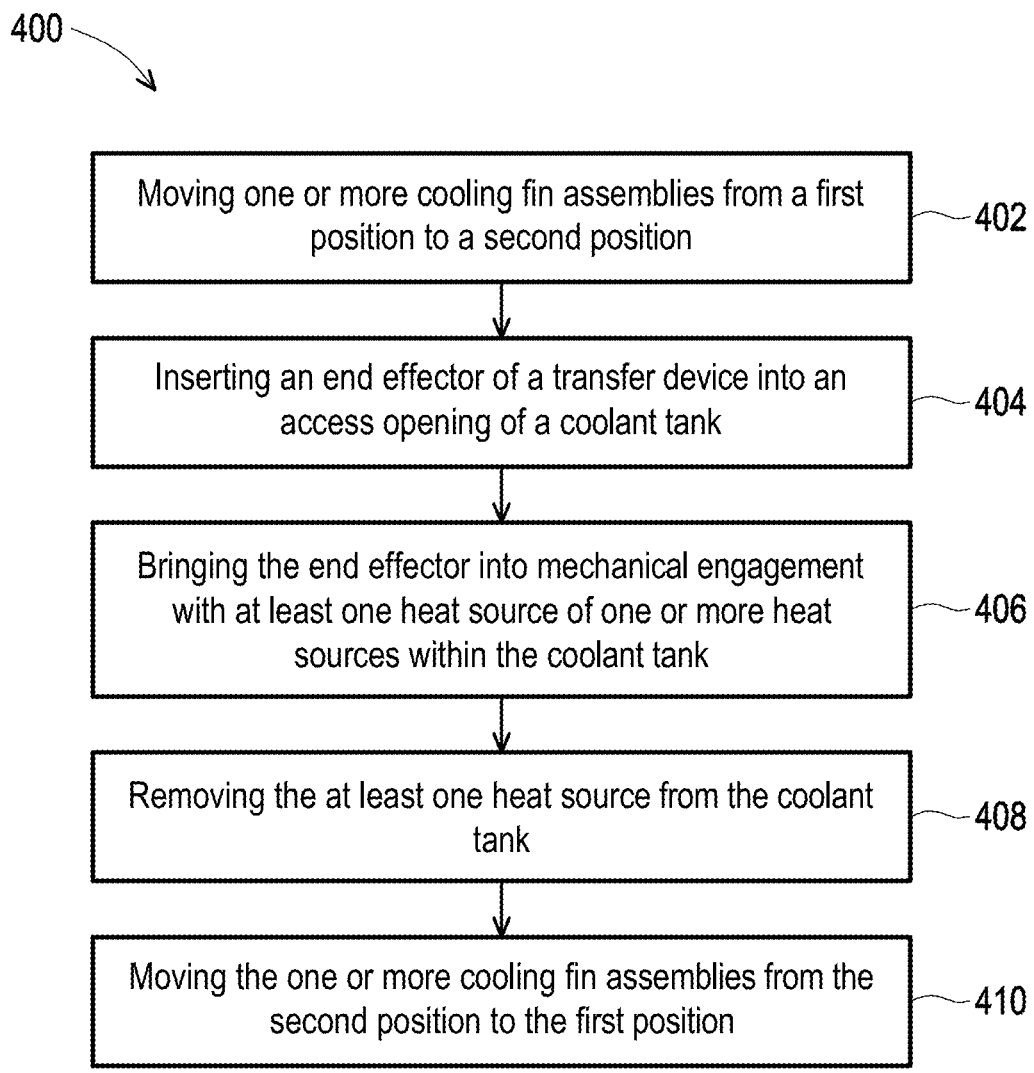
FIG. 6 is a flowchart of a method of removing a heat source from a coolant tank, in accordance with some embodiments.

FIG. 6 is directed to a flowchart 400 of a method of removing at least one of the one or more heat sources 222 from the coolant tank 202 of the coolant system 200, in accordance with some embodiments. The flowchart 400 includes a first step 402, a second step 404, a third step 406, a fourth step 408, and a fifth step 410. It will be readily appreciated that reference to these various numbered steps does not necessarily indicate an exact order in which these respective steps occur in various embodiments of the method of removing at least one of the one or more heat sources 222 from the coolant tank 202 of the coolant system 200 of the flowchart 400.

Assuming that the first and second cooling fin assemblies 230a, 230b are in the first position (i.e., the closed position) as shown in FIG. 2A, in the first step 402 the first and second cooling fin assemblies 230a, 230b are moved to the second position (i.e., the opened position) as shown in FIG. 2B by initiating operation of the actuator 237. When the actuator 237 is initiated, the first and second cooling fin assemblies 230a, 230b rotate away from the coolant cavity 204 and away from each other. The actuator 237 rotates the first and second cooling fin assemblies 230a, 230b away from the first angle 232 and towards the second angle 233. The actuator rotating the first and second cooling fin assemblies 230a, 230b from first position to the second position results in the access opening 206 being exposed to provide access to the coolant cavity 204.

If there is any remaining coolant droplets 212 still present within the spaces 266 of the first and second cooling fin assemblies 230a, 230b or on the fifth surfaces 254 of the drip tray portions 260 of the porous drip trays 236 of the first and second cooling fin assemblies 230a, 230b, the remaining coolant droplets 212 slide along the fifth surfaces 254 of the drip tray portions 260 and out the side openings 264 of the drip tray portions 260 of the porous drip trays 236 of the first and second cooling fin assemblies 230a, 230b and into a corresponding one of the first and second coolant flow structures 208a, 208b due to the rotation of the first and second cooling fin assemblies 230a, 230b away from the first angle 232 and towards the second angle 233. The remaining coolant droplets 212 then move along the first and second coolant flow structures 208a, 208b back to the coolant 220 in the liquid state stored within the coolant tank 202 of the coolant system 200. This sliding of the remaining coolant droplets 212 out of the space 266 along the fifth surfaces 254 of the drip tray portions 260 of the porous drip trays 236 of the first and second cooling fin assemblies 230a, 230b is represented by the arrows 218 as shown in FIG. 2B of the present disclosure.

After the first step 402 in which the first and second cooling fin assemblies 230a, 230b are moved from the first position (e.g., the closed position as shown in FIG. 2A of the present disclosure) to the second position (e.g., the opened position as shown in FIG. 2B of the present disclosure), in the second step 404, the end effector 242 of the transfer device 243 is inserted into the coolant cavity 204 through the access opening 206. After the second step 404 in which the end effector 242 is inserted into the coolant cavity 204 of the coolant tank 202, the end effector is brought into mechanical engagement with at least one of the one or more heat sources 222. When the one or more heat sources are servers, the end effector 242 mechanically engages with at least one of the servers of the one or more servers. After the third step 406 in which the end effector is brought into mechanical engagement with at least one heat source of the one or more heat sources 222, the end effector 242 is actuated away from the coolant 220 stored within the coolant tank 202 by the transfer device 243 when in mechanical engagement with the at least one heat source of the one or more heat sources 222, which removes the at least one heat source of the one or more heat sources 222 from the coolant cavity and through the access opening 206. The second, third, and fourth steps 404, 406, 408 may be repeated successively to remove multiple ones of the one or more heat sources. Once the desired number of the one or more heat sources 222 has been removed, new heat sources may be inserted into the coolant cavity 204 of the coolant tank 202 through the access opening of the coolant tank 202 by performing a process similar to the one as described with respect to the flowchart 400. After the fourth step 408 in which at least one heat source of the one or more heat sources 222 is removed, in the fifth step 410, the actuator 237 is initiated to move the first and second cooling fin assemblies 230a, 230b from the second position (i.e., the opened position) as shown in FIG. 2B back to the first position (i.e., the closed position) as shown in FIG. 2A. The method of the flowchart 400 may be utilized when replacing respective ones of the one or more heat sources 222 within the coolant tank 202.

While not shown, in an alternative embodiment, a lid or sealing cap, which may be like the lid or sealing cap 103 as shown and discussed with respect to FIG. 1, may overlap and cover the first and second cooling fin assemblies 230a, 230b when the first and second cooling assemblies 230a, 230b are in the first position (i.e., the closed position) as shown in FIG. 2A. In the alternative embodiment, when the lid is present, the lid is removed before the first step 402 such that the first and second cooling assemblies 230a, 230b are movable from the first position towards the second position without bumping against the lid.

Figure 7A:
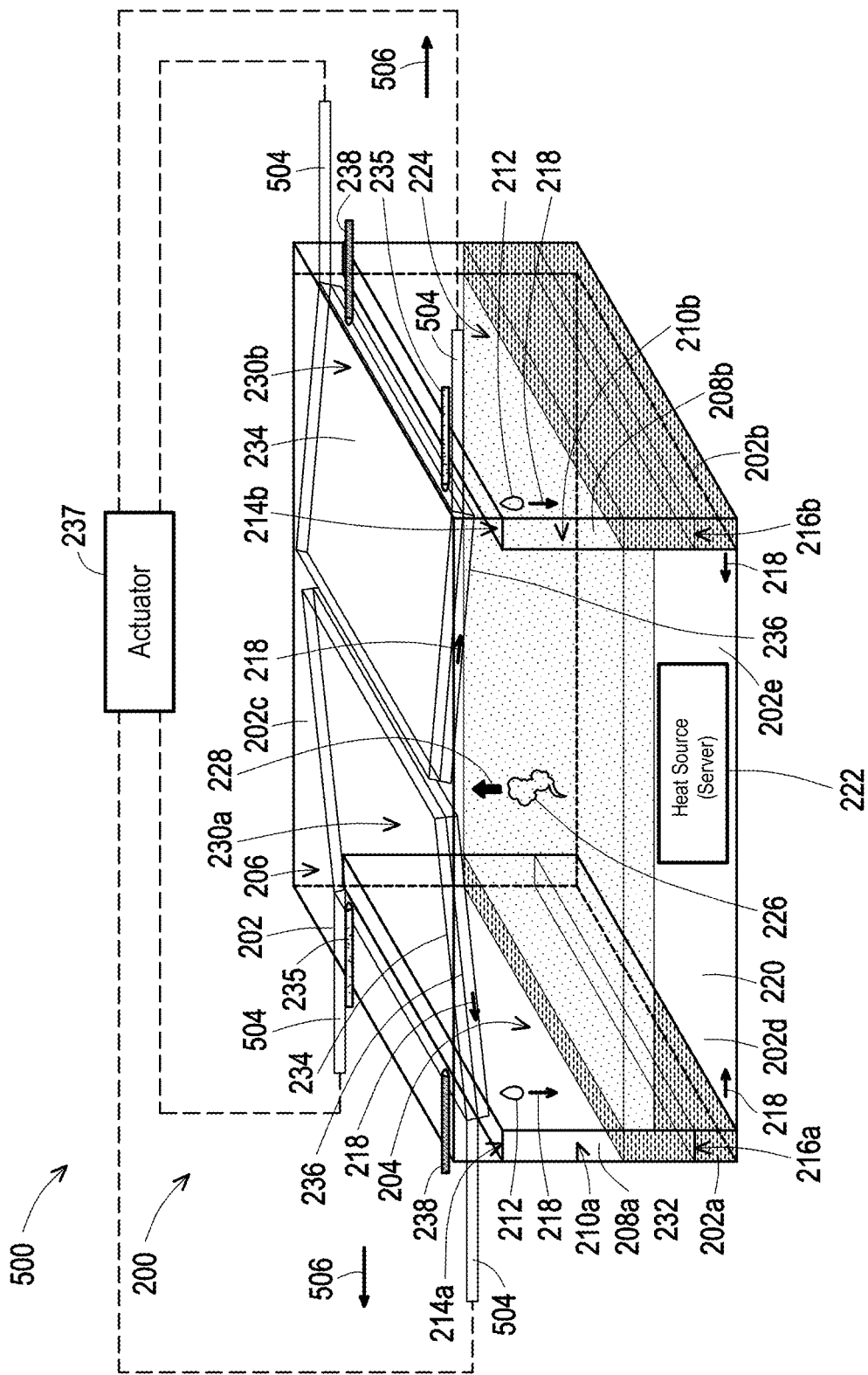
FIG. 7A is a perspective view of a coolant system, in accordance with some embodiments.
Figure 7B:
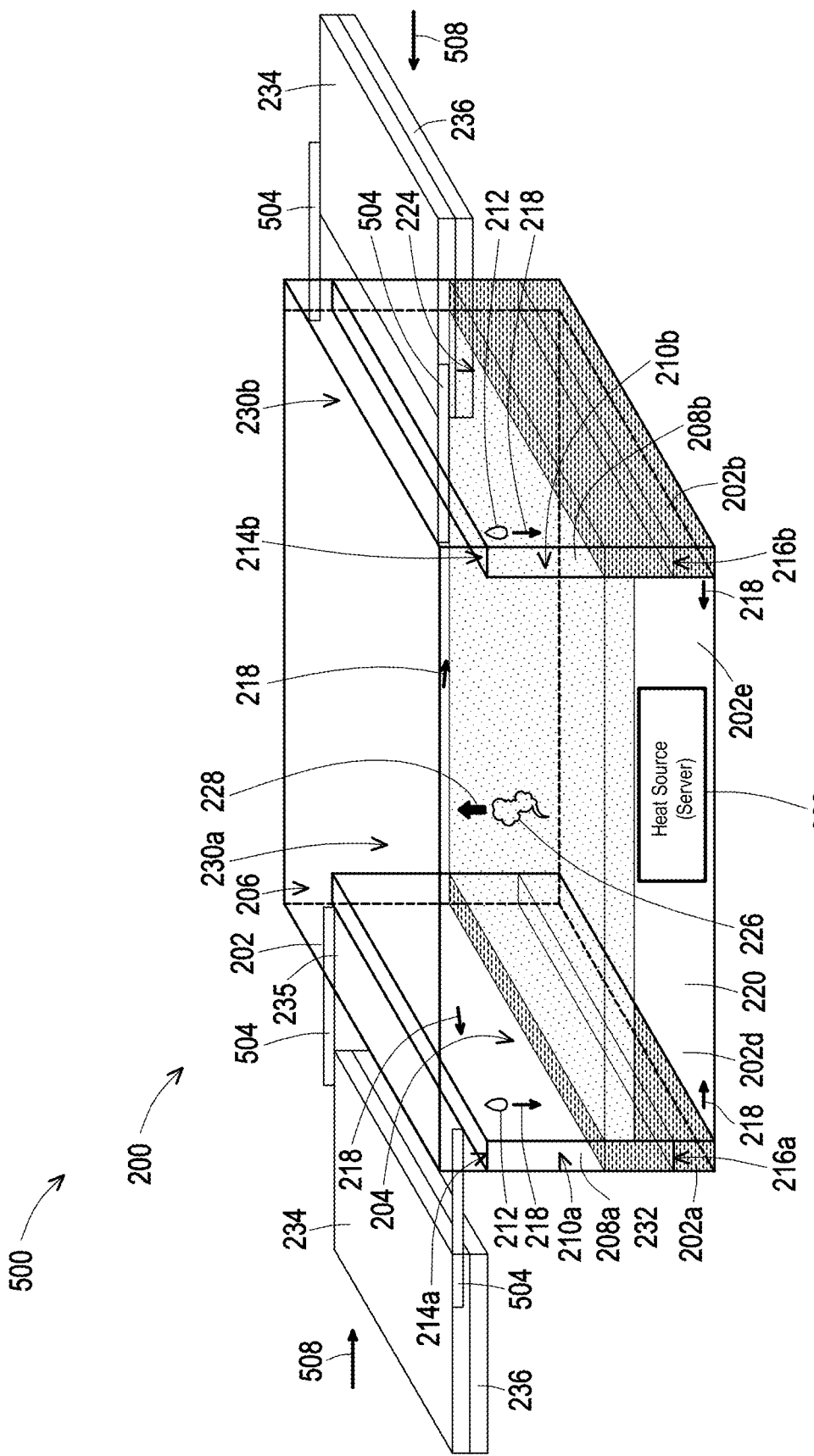
FIG. 7B is a perspective view of a coolant system, in accordance with some embodiments.

FIGS. 7A and 7B are perspective views of a coolant system 500, in accordance with some embodiments. The coolant system 500 includes a rail system 502 that may be in mechanical cooperation with the actuator 237. Unlike the coolant system 200 in which the first and second cooling fins 230a, 230b are rotatable about hinges between the first and second positions as shown in FIGS. 2A and 2B, the first and second cooling fins 230a, 230b are movable along one or more rails 504 of the rail system 302 between a first position as shown in FIG. 7A (i.e., a closed position as shown in FIG. 7A) and a second position as shown in FIG. 7B (i.e., an opened position as shown in FIG. 7B).

As shown in FIG. 7A, the first and second cooling fins 230a, 230b are movable in first directions, respectively, along the one or more rails 504 as represented by the arrows 506. In other words, the first and second cooling fins 230a, 230b are moved along the one or more rails 504 from the first position as shown in FIG. 7A towards the second position as shown in FIG. 7B.

As shown in FIG. 7B, the first and second cooling fins 230a, 230b are movable in second directions, respectively, along the one or more rails 504 as represented by the arrows 508. In other words, the first and second cooling fins 230a, 230b are moved along the one or more rails 504 from the second position as shown in FIG. 7B towards the first position as shown in FIG. 7A. The actuator 237 is hidden in FIG. 7B for ease of visibility of the position of the first and second cooling fins 230a, 230b when in the second position as shown in FIG. 7B.

As should be readily apparent in view of the discussion herein, the first and second cooling fins 230a, 230b in the coolant system 500 may be moved between the first and second positions (i.e., the closed position and the opened position as shown in FIGS. 7A and 7B) to remove the heat sources 222 from the coolant tank 202 or to insert the heat sources into the coolant tank 222. For example, when the first and second cooling fin assemblies 230a, 230b are in the second position (i.e., the opened position as shown in FIGS. 7A and 7B), the end effector 242 of the transfer device 243 may be inserted between the first and second cooling fin assemblies 230a, 230b and be inserted into the coolant cavity 204 to remove or insert the one or more heat sources 222 into or out of the coolant cavity 204.

In some embodiments or situations, the first and second cooling fin assemblies 230a, 230b may be positioned or adjusted to be at any intermediate position between the first and second positions as shown in FIGS. 7A and 7B, respectively. For example, the first and second cooling fin assemblies 230a, 230b may be only partially opened and the end effector 242 of the transfer device 243 may still be inserted between the first and second cooling fin assemblies 230a, 230b and into the coolant cavity 204 to insert or remove the one or more heat sources into or out of the coolant cavity 204.

While in FIG. 7B it is shown that the first and second cooling fin assemblies 230a, 230b are configured to, in operation, move leftward and rightward based on the orientation as shown in FIG. 7B, it will be readily appreciated that the first and second cooling fin assemblies 230a, 230b could instead move in an aft or forward direction instead of moving in the leftward or rightward direction depending on how the rail system 502 of the coolant system 500 is setup.

In some embodiments, when the first and second cooling fin assemblies 230a, 230b are in their opened position (e.g., similar to the second position as shown in FIG. 7B of the present disclosure), the first and second cooling fin assemblies 230a, 230b leave no more than 25% of the coolant surface 224 of the coolant 220 exposed. In other words, at least 75% of the coolant surface 224 of the coolant 220 is covered by the first and second cooling fin assemblies 230a, 230b when the first and second cooling fin assemblies 230a, 230b are in their opened position. In some embodiments, the first and second positions as shown in FIGS. 7A and 7B may be at different locations.

In view of the discussion herein, the coolant system 200 including the coolant tank 202 and the first and second cooling fin assemblies 230a, 230b is more efficient than the utilizing the coolant tank 100. For example, as discussed earlier herein, when the coolant tank 100 is utilized, the condensed coolant droplets drop directly back into the coolant in the liquid state and disturb the surface of the coolant in the liquid state. This disturbance of the surface of the coolant in the liquid state due to the coolant droplets dropping directly onto the surface of the coolant reduces the efficiency at which the coolant in the coolant tank 100 may cool down or mitigate increasing temperature of electronic components present within the coolant tank 100. Alternatively, the coolant system 200 including the first and second cooling fin assemblies 230a, 230b that direct the flow of the coolant droplets 212 through the first and second coolant flow structures 208a, 208b instead of being dropped directly back to the coolant surface 224 results in the coolant system 200 being much more efficient in cooling the one or more heat sources 222 than when utilizing the coolant tank 100. The coolant system 200 being more efficient than the coolant tank 100 means that utilization of the coolant system 200 over the coolant tank 100 will decrease energy costs as energy utilized to cool the one or more heat sources 222 is decreased when utilizing the coolant system 200 over the coolant tank 100.

At least one embodiment of a system of the present disclosure may be summarized as including: a tank including a space configured to, in operation, contain a coolant; a first cooling fin movably coupled to the tank, the first cooling fin overlaps the space and is rotatably movable relative to the tank; a first porous drip tray is between the space and the first cooling fin, the porous drip tray including one or more openings extending through the first porous drip tray.

At least one embodiment of a device of the present disclosure may be summarized as including: a cooling fin including a first side and a second side opposite to the first side; a porous drip tray coupled to the cooling fin, the porous drip tray being at the first side of the cooling fin, the porous drip tray including: a tray structure including a third side and fourth side opposite to the third side, the third side faces towards the cooling fin and the fourth side faces away from the cooling fin; one or more protrusions that extend outward from the tray structure towards the first side of the cooling fin; and one or more first openings extend through the tray structure and extend through the one or more protrusions, each respective first opening of the one or more first openings extends through a corresponding protrusion of the one or more protrusions.

A method of the present disclosure may be summarized as including: cooling one or more electronic components within a coolant stored within a coolant tank converting coolant from a liquid state to a vapor state; passing the coolant in the vapor state through one or more openings of a porous drip tray overlapping a surface of the coolant stored within the coolant tank; passing a fluid through a fluid passageway in a cooling fin overlapping the porous drip tray; condensing the coolant in the vapor state to droplets of the coolant in the liquid state along a surface of the cooling fin that faces towards the porous drip tray allowing the droplets to fall from the surface of the cooling fin onto a drip tray surface of the porous drip tray; and directing a flow of the droplets of the coolant in the liquid state along a drip tray surface of the porous drip tray to a sidewall of the coolant tank allowing the droplets of the coolant in the liquid state to travel along an internal surface of the sidewall to the coolant in liquid state stored within the coolant tank.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a tank including a space configured to, in operation, contain a coolant; and
   a first cooling fin assembly rotatably coupled to the tank, the first cooling fin assembly including:
   a first cooling fin overlapping the space; and
   a first porous drip tray is between the space and the first cooling fin, the first porous drip tray including one or more openings extending through the first porous drip tray.

2. The system of claim 1, wherein the first porous drip tray is coupled to the first cooling fin.

3. The system of claim 1, wherein:
   the first cooling fin including a surface that faces towards the space and the first porous drip tray; and
   the first porous drip tray includes:
   a drip tray portion including a drip tray surface that faces towards the surface of first cooling fin and is overlapped by the surface of the first cooling fin; and
   one or more cylindrical structures, each respective cylindrical structure of the one or more cylindrical structures extends around a corresponding opening of the one or more openings and delimits the corresponding opening of the one or more openings.

4. The system of claim 3, wherein each respective cylindrical structure of the one or more cylindrical structures includes an end between the surface of the first cooling fin and the tray surface of the porous drip tray, and the end is in closer proximity to the tray surface than the surface of the first cooling fin.

5. The system of claim 3, wherein the first porous drip tray further includes:
   boundary structure that protrudes from the tray surface towards the surface of the first cooling fin, and the boundary structure extends along one or more sides of the porous drip tray; and
   at least one opening that extends through the boundary structure.

6. The system of claim 1, further comprising a fluid passageway in the first cooling fin, the fluid passageway that extends through the first cooling fin.

7. The system of claim 6, further comprising:
   an inlet in the first cooling fin and in fluid communication with the fluid passageway; and an outlet in the first cooling fin and in fluid communication with the fluid passageway.

8. The system of claim 7, wherein the fluid passageway, the inlet, and the outlet are configured to, in operation, allow a fluid to pass through the first cooling fin to convert the coolant in a vapor state to the coolant in a liquid state by the coolant in the vapor state condensing into the coolant in the liquid state on the surface of the cooling fin.

9. The system of claim 8, wherein the coolant in the liquid state drips off the surface of the first cooling fin onto the tray surface of the drip tray.

10. The system of claim 1, wherein the first porous drip tray includes:
a drip tray portion including a drip tray surface that faces towards the surface of the first cooling fin and is overlapped by the surface of the first cooling fin; and
one or more cylindrical structures, each respective cylindrical structure of the one or more cylindrical structures extends around a corresponding opening of the one or more openings and delimits the corresponding opening of the one or more openings.

11. The system of claim 1, further comprising:
a second cooling fin assembly rotatably coupled to the tank, the second cooling fin including:
a second cooling fin overlapping the space; and
a second porous drip tray is between the space and the second cooling fin, the porous drip tray including one or more openings extending through the second porous drip tray.

12. A device, comprising:
a cooling fin including a first side and a second side opposite to the first side; and
a porous drip tray coupled to the cooling fin, the porous drip tray being at the first side of the cooling fin, the porous drip tray including:
a tray structure including a third side and fourth side opposite to the third side, the fourth side faces towards the cooling fin and the third side faces away from the cooling fin;
one or more protrusions that extend outward from the tray structure towards the first side of the cooling fin; and
one or more first openings that extend through the tray structure and extend through the one or more protrusions, each respective first opening of the one or more first openings extends through a corresponding protrusion of the one or more protrusions.

13. The device of claim 12, wherein the porous drip tray further includes:
a boundary structure that extends from the tray structure and extends partially around the tray structure; and
a second opening extending through the boundary structure.

14. The device of claim 12, further comprising a fluid passageway in the cooling fin, the fluid passageway extending through the cooling fin.

15. The device of claim 14, further comprising:
an inlet in the cooling fin and in fluid communication with the fluid passageway; and
an outlet in the cooling fin and in fluid communication with the fluid passageway.

16. A method, comprising:
cooling one or more electronic components within a coolant stored within a coolant tank converting coolant from a liquid state to a vapor state;
passing the coolant in the vapor state through one or more openings of a porous drip tray overlapping a surface of the coolant stored within the coolant tank;
passing a fluid through a fluid passageway in a cooling fin overlapping the porous drip tray;
condensing the coolant in the vapor state to droplets of the coolant in the liquid state along a surface of the cooling fin that faces towards the porous drip tray allowing the droplets to fall from the surface of the cooling fin onto a drip tray surface of the porous drip tray; and
directing a flow of the droplets of the coolant in the liquid state along the drip tray surface of the porous drip tray to a sidewall of the coolant tank allowing the droplets of the coolant in the liquid state to travel along an internal surface of the sidewall to the coolant in liquid state stored within the coolant tank.

17. The method of claim 16, further comprising positioning the cooling fin and the porous drip tray to a first position at which the cooling fin and the porous drip tray are tilted relative to the sidewall of the coolant tank.

18. The method of claim 17, wherein positioning the cooling fin and porous drip tray includes rotating the cooling fin and the porous drip tray.

19. The method of claim 16, further comprising rotating the cooling fin and the porous drip tray away from the surface of the coolant providing an access opening.

20. The method of claim 19, further comprising removing at least one of the one or more electronic components within the coolant stored within the tank through the access opening.

* * * * *